United States Patent
Aminpur

(10) Patent No.: US 6,555,472 B2
(45) Date of Patent: Apr. 29, 2003

(54) METHOD OF PRODUCING A SEMICONDUCTOR DEVICE USING FEATURE TRIMMING

(75) Inventor: Massud A. Aminpur, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/816,877

(22) Filed: Mar. 21, 2001

(65) Prior Publication Data

US 2002/0045331 A1 Apr. 18, 2002

(30) Foreign Application Priority Data

Oct. 17, 2000 (DE) .......................... 100 51 380
Dec. 7, 2000 (DE) .......................... 100 60 874

(51) Int. Cl.$^7$ .............................................. H01L 21/44
(52) U.S. Cl. ...................... 438/669; 438/618; 438/636; 438/671; 438/720; 438/725
(58) Field of Search ................. 438/618, 636, 438/669, 671, 685, 720, 725

(56) References Cited

U.S. PATENT DOCUMENTS

| | | | | |
|---|---|---|---|---|
| 5,240,559 A | * | 8/1993 | Ishida | 216/78 |
| 5,651,856 A | * | 7/1997 | Keller et al. | 438/695 |
| 5,804,088 A | * | 9/1998 | McKee | 216/47 |
| 5,963,841 A | * | 10/1999 | Karlsson et al. | 438/952 |
| 5,968,844 A | * | 10/1999 | Keller | 438/695 |
| 6,153,530 A | * | 11/2000 | Ye et al. | 438/720 |
| 6,303,416 B1 | * | 10/2001 | Bruce et al. | 438/166 |
| 6,323,093 B1 | * | 11/2001 | Xiang et al. | 438/299 |

FOREIGN PATENT DOCUMENTS

| | | | | |
|---|---|---|---|---|
| EP | 0 394 597 A1 | 10/1990 | ......... | H01L/21/027 |
| JP | 05275393 | * 10/1993 | ......... | H01L/21/302 |

OTHER PUBLICATIONS

Toshiharu (JP–05275393) (Translation).*

* cited by examiner

*Primary Examiner*—Amir Zarabian
*Assistant Examiner*—Maria Guerrero
(74) *Attorney, Agent, or Firm*—Williams, Morgan & Amerson, P.C.

(57) ABSTRACT

With standard DUV lithography technology it is not easy to achieve MOS transistor gates in sub-100 nm range. With the method of trim-etching in HI/O$_2$ plasmas there is an opportunity to use the current lithography tools, to reduce the dimensions of the resist feature, and to achieve sub-100 nm MOS transistor gates for advanced devices. The method of trim-etching in HI/O$_2$ plasmas delivers another factor to control the critical dimension of the MOS devices very accurately. Therefore, this invention helps to significantly reduce the total cost for manufacturing small MOS devices with a critical dimension in the sub-100 nm range.

5 Claims, 1 Drawing Sheet

METHOD OF PRODUCING A SEMICONDUCTOR DEVICE USING FEATURE TRIMMING

BACKGROUND OF THE INVENTION

1. Field of the Invention

The present invention relates to a method of producing a semiconductor device using feature trimming to obtain a feature definition smaller than the lithographic resolution limit. The present invention in particular relates to a method of producing a semiconductor device using a lithographic method for producing a resist feature on a surface of the semiconductor and of etching the resist feature in a lateral direction using a reactivity-inhibited etchant.

2. Description of the Related Art

The manufacturing process of integrated circuits involves the fabrication of numerous insulated gate field-effect transistors, such as metal-oxide semiconductor field-effect transistors (MOSFETs). In order to increase integration density and improve device performance, for instance, with respect to signal processing time and power consumption, feature sizes of the transistor structures are steadily decreasing. Most importantly, the gate length of the fabricated transistors needs to be reduced to comply with these requirements.

In a field-effect transistor, such as a MOSFET, the gate electrode is used to control an underlying channel formed in the semiconductor substrate between a source region and a drain region. The channel, source region, and drain region are formed in, on, and/or over a semiconductor substrate that is doped inversely to the drain and source regions. The gate electrode is separated from the channel, the source region, and the drain region by a thin insulating layer, generally an oxide layer.

The formation of the gate electrode is a critical step in the manufacturing process of the field-effect transistor. The gate length dimension, i.e., the lateral extension of the gate electrode between the source region and the drain region of the field-effect transistor in the direction of the current flow path, is commonly known as a critical dimension of the gate electrode. This critical dimension is desirably reduced to sizes approaching or even exceeding the resolution limit of the lithographic systems used for patterning the device features.

Conventionally, device features are defined and delineated by lithographic techniques, in particular photolithography, preferably using a high numerical aperture lens and a deep ultraviolet (DUV) light source. Current DUV lithography reaches its resolution limit at a feature size of approximately 0.2 $\mu$m (200 nm).

Currently, metal-oxide semiconductor (MOS) transistor with gate lengths in the sub-100 nm range can not easily be obtained with the generally known DUV lithography technology. Other production methods used to obtain such gates in the sub-100 nm range, like electron beam patterning, have reduced throughput and yield, and are, therefore, a significant contributor to the cost of manufacturing in the semiconductor industry. Such an MOS transistor gate in the sub-100 nm range is, however, necessary to obtain small semiconductor devices, which are required, i.e., for increasing clock frequencies in processors used in computers, and for keeping the gate current as low as possible to achieve a nearly ideal voltage amplification.

To meet the above requirements, there is a demand for a technique to delineate feature sizes beyond the resolution limit of DUV lithography. To comply with the general requirements of mass production of semiconductor devices, any new technology must conserve the current standards of efficiency, reliability and cost of already existing methods or provide improvements in this respect.

In view of the above-mentioned problems, a need exists for a method for patterning gate electrodes of field-effect transistors in integrated circuits to a size smaller than the resolution limit of currently available standard DUV photolithography tools, currently about 200 nm.

The present invention is directed to a method of making a semiconductor device that solves, or at least reduces, some or all of the aforementioned problems.

SUMMARY OF THE INVENTION

This invention provides a method of producing semiconductor devices having feature sizes smaller than the resolution limit of the lithography used for feature definition.

According to one aspect of the invention there is provided a method of producing a semiconductor device comprising: providing a semiconductor substrate having a surface, forming a layer of gate electrode material above the surface of said the semiconductor substrate, and forming a resist feature above the layer of the gate electrode material. The method also comprises the resist feature having a lateral dimension, reducing the lateral dimension of the resist feature, and patterning at least the layer of gate electrode material using the resist feature with the reduced lateral dimension.

According to another aspect of the invention there is provided a method of producing a semiconductor device comprising: providing a semiconductor substrate having an anti-reflective coating layer and a surface over the anti-reflective coating layer, forming a layer of gate electrode material above the surface, and forming a resist feature above the layer of the gate electrode material. The method also comprises the resist feature having a lateral dimension, reducing the lateral dimension of the resist feature by etching the resist feature during a plasma etch-process comprising hydrogen iodine and oxygen plasmas, having an etch-rate in the lateral direction, and patterning at least the layer of gate electrode material using the resist feature with the reduced lateral dimension.

According to the present invention, a more precise shrinkage of the gate length of an MOS transistor can be achieved, if the gate-forming resist feature is shrunk rather than the final gate electrode. The invention described herein enables a significant reduction of MOS transistor gate dimensions and, therefore, of the whole MOS transistor, and, consequently, a significant reduction in power consumption of the device and an increase in processing speed can be achieved.

BRIEF DESCRIPTION OF THE DRAWINGS

The invention may be understood by reference to the following description taken in conjunction with the accompanying drawings, in which like reference numerals identify like elements, and in which.

Figure 1:
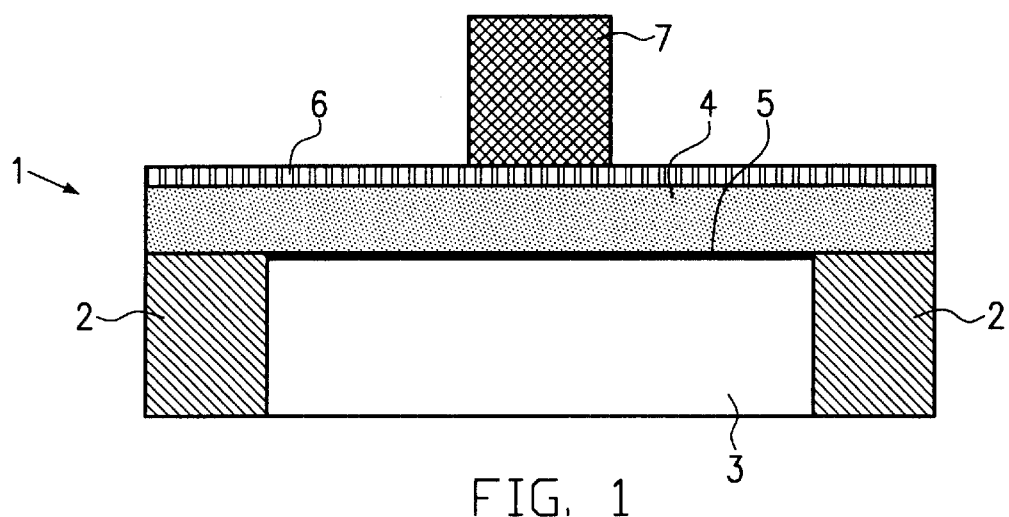
FIG. 1 is a schematic cross-sectional view of a semiconductor substrate after forming a resist feature according to prior art.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

While the present invention is described with reference to the embodiment as illustrated in the following detailed description as well as in the drawings, it should be understood that the following detailed description as well as the drawings are not intended to limit the present invention to the particular embodiment disclosed, but rather the described embodiment merely exemplifies the various aspects of the present invention, the scope of which is defined by the appended claims.

With reference to FIG. 1, an illustrative example of forming a MOS transistor according to a typical prior art process will be described. It is to be noted that FIG. 1 as well as the following drawings in this application are merely schematic depictions of the various stages in manufacturing the illustrative device under consideration. The skilled person will readily appreciate that the dimensions shown in the figures are not true to scale and that different portions or layers are not separated by sharp boundaries as portrayed in the drawings but may instead comprise continuous transitions. Furthermore, various process steps as described below may be performed differently depending on particular design requirements. Moreover, in this description, only the relevant steps and portions of the device necessary for the understanding of the present invention are considered.

FIG. 1 shows a schematic cross-section of an MOS transistor at a specific stage of a typical prior art manufacturing process. Within a silicon substrate 1, shallow trench isolations 2, e.g., made of silicon dioxide, are formed defining a transistor active region 3 in which a channel, a drain region and a source region will be formed. A gate insulation layer is formed above the substrate 1. The gate insulation layer 5 may be formed by a variety of techniques, e.g., thermal growth, chemical vapor deposition (CVD), and the like, and it may be comprised of a variety of materials, e.g., an oxide, an oxynitride, silicon dioxide, and the like. Thereafter, a layer of gate electrode material 4 is formed above the gate insulation layer 5. The layer of gate electrode material 4 may be formed from a variety of materials, e.g., polysilicon, a metal, and the like, and it may be formed by a variety of techniques, e.g., CVD, low-pressure chemical vapor deposition (LPCVD), sputter deposition, and the like. In one illustrative embodiment, the gate insulation layer 5 is comprised of a thermally grown layer of silicon dioxide, and the layer of gate electrode material 4 is comprised of a deposited layer of polysilicon.

Next, as indicated in FIG. 1, an anti-reflective coating layer 6 may be, if desired or necessary, formed above the layer of gate electrode material 4. The anti-reflective coating layer 6 may or may not be required in all applications. When used, the anti-reflective coating layer 6 assists in subsequent patterning of the layer of gate electrode material 4 by reducing scattering and reflection of the light source used in photolithography processes. Of course, as discussed above, the anti-reflective coating layer 6 may not be required in all cases, and, thus, it should not be considered a limitation of the present invention unless specifically set forth in the appended claims.

The next step involves formation of a photoresist feature 7 from a layer of resist (not shown). The process steps involved in patterning the layer of resist to produce the resist feature 7 are of common knowledge to the skilled person. These steps usually include the formation of a layer of resist by a spin-coating process, and the employment of short exposure wavelengths, such as wavelengths in the DUV range, while performing the required photolithography steps. Since these procedures are commonly known, the description thereof will be omitted. After patterning the layer of resist, a resist feature 7 is formed covering the area where the gate electrode of the transistor is to be formed.

Figure 2:
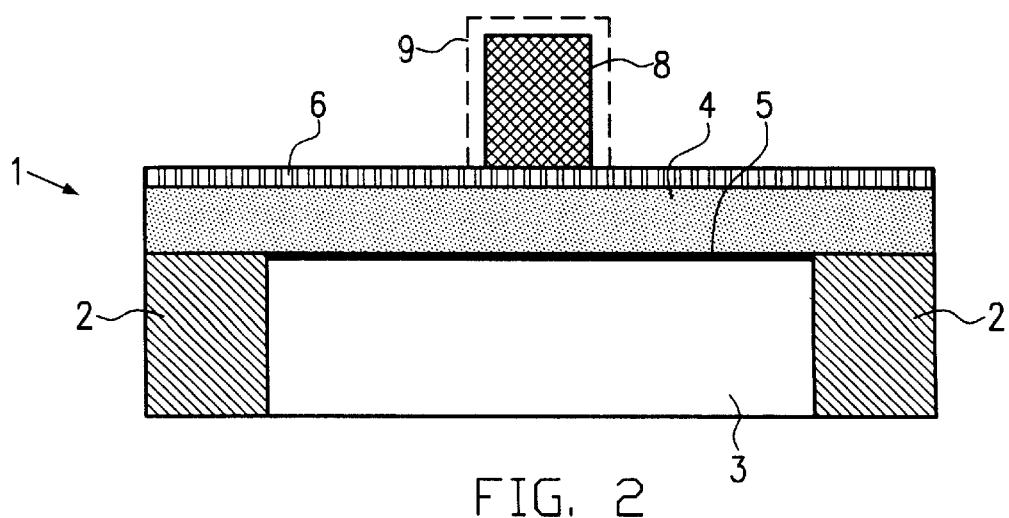
FIG. 2 is a schematic cross-sectional view of the semiconductor substrate after trimming the resist feature according to a preferred embodiment of this invention.

FIG. 2 shows a schematic cross-section of the MOS transistor of FIG. 1 after trimming the resist feature 7 to define a trimmed resist feature 8. The outline 9 of resist feature 7 before trimming is shown as a dashed line. In one illustrative embodiment, the trimming was carried out by dry etching the resist feature 7 in a hydrogen iodide/oxygen ($HI/O_2$) plasma to shrink the resist feature 7 in a lateral direction, which is the direction substantially parallel to the surface of the substrate 1 as well as the drawing plane in FIG. 2, to a dimension in the sub-100 nm range.

Besides $HI/O_2$ plasmas, other etchants containing an etch inhibitor are suitable to slow the etch-rate so that time controlling the trimming process is feasible. For example, other etch inhibitors comprise hydrogen bromide (HBr), hydrogen chloride (HCl), hydrogen fluoride (HF), and the like. Additionally, other etchants that may be used with these inhibitors comprise carbon monoxide (CO), carbon dioxide ($CO_2$), or other oxygen-containing gases. Lastly, instead of using a relatively fast etchant with an inhibitor, etchants which are intrinsically slow can be used. Such etchants include hydrogen (H) or other hydrogen-containing gases.

The etching, while not necessarily being isotropic, shall at least have a substantial lateral etching component. When oxygen-containing plasma etch-processes are used, iodine has proven to be a particularly suitable etch-rate inhibitor as it has a lower self-bias than, for instance, fluorine, chlorine, or bromine, resulting in a lower energy of the ions when impinging on the substrate surface.

Figure 3:
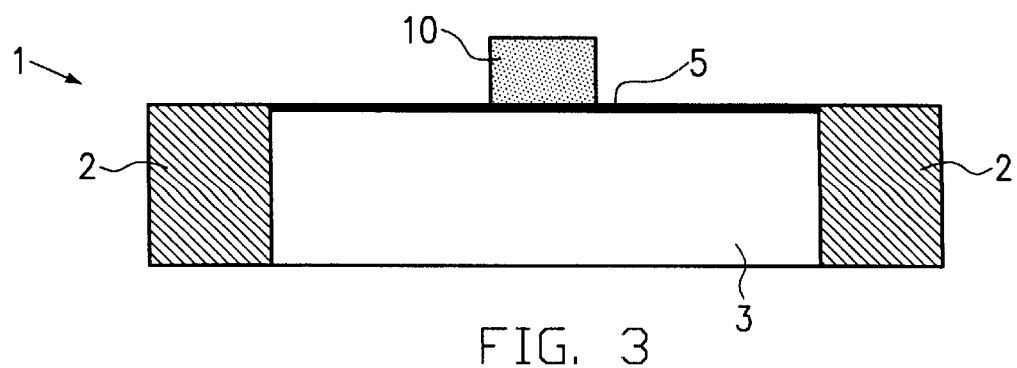
FIG. 3 is a schematic cross-sectional view of the semiconductor substrate after further common processing of the substrate and the trimmed resist feature.

FIG. 3 shows a schematic cross-section of the MOS transistor of FIG. 2 after etching of the anti-reflective coating layer 6 and the layer of gate electrode material 4 has been performed, and after removing all remaining parts of the trimmed resist feature 8 and the anti-reflective coating layer 6. As a result of this method, a gate electrode 10, with a critical dimension in sub-100 nm range, is formed from the layer of gate electrode material 4.

In various illustrative alternative embodiments, the method of the present invention may be applied not only to MOS transistors but also to metal-insulator semiconductor (MIS) transistors, and/or other integrated circuit devices.

The term "resist" as used herein is to be understood to encompass any material suitable to protect an underlying surface during a process treatment. Thus, a resist may be any organic or inorganic chemical substance or compound which can be blanket-deposited and patterned for feature definition. The resist must have process selectivity relative to the underlying material, such as significantly differing etch-rates, or it may act as a shielding element, for instance, to protect the underlying surface from material deposition or ion bombardment. It is also possible to use a thermo-variable resist which shrinks to lower dimensions, at least substantially in the lateral direction, when treated with heat. For example, a thermo-variable resist such as UV5®, UV110™, or K2G may be used. Such a heat treatment of a thermo-variable resist commonly comprises a baking process with temperatures of approximately 90° C. to 150° C. and a duration of approximately two minutes, and results in a shrinkage in the lateral direction of approximately 5%.

The resist used in the MOS production processes, according to one illustrative embodiment of this invention, is usually chosen from the standard DUV resist group, which comprises UV5®, UV110™, and K2G.

The additional trimming step during the production process of the MOS transistor mainly comprises trimming the resist feature 7 in a lateral direction, which is a direction substantially parallel to the surface of the substrate 1 as well as the drawing plane in FIG. 2. In one embodiment, the trimming procedure described herein comprises a plasma etching of the resist feature 7. In one illustrative embodiment, the plasma etch-process makes use of plasmas that contain oxygen ($O_2$) and iodine (I). For the iodine-containing plasmas, hydrogen iodide (HI) is used. The use of iodine-containing plasmas leads to a lower self-bias compared to fluorine (F), chlorine (Cl), and bromine (Br) based plasmas, which is due to the fact that iodine is much more ionized in such plasmas. Therefore, the ions generated in the etching plasma have lower energy when they impact the surface of the substrate 1, which results in lower damage of the surface. Additionally, iodine-containing plasmas have an etch-rate that is more controllable and lower than fluorine, chlorine, and bromine based plasmas, and lies between approximately 0.8 nm/s and 3 nm/s.

The plasma reactor for the trimming step, according to one embodiment of the present invention, is operated with a hydrogen iodide (HI) gas having a first gas flow rate and with oxygen ($O_2$) gas having a second gas flow rate. The ratio between the first and second gas flow rates lies between approximately 20 to 1 and 3 to 1. In a further process modification, inert gases like helium (He) or argon (Ar) can be admixed to oxygen, having a third gas flow rate for helium and a fourth gas flow rate for argon. The gas flow rates for argon or helium and for oxygen will have a ratio between approximately 20 to 1 and 3 to 1 as well.

In the various illustrative embodiments of the invention where the gate electrode 10 is comprised of polysilicon, an anti-reflective coating layer 6 may be used. In such a situation, the anti-reflective coating layer 6 prevents the polycrystalline silicon layer 4 from being etched by the HI-containing plasmas. One commonly used anti-reflective coating layer 6 is comprised of silicon oxynitride ($SiO_xN_y$). The plasma etch-process, according to these embodiments of the present invention, has a much higher selectivity to the resist feature 7 than to the anti-reflective coating layer 6, as compared to the selectivity between the resist feature 7 and the polycrystalline silicon layer 4 in embodiments when the anti-reflective coating layer 6 is missing. The resist feature 7 etched by the HI-containing plasmas is affected approximately 10 to 20 times more than the anti-reflective coating layer 6. Without an anti-reflective coating layer 6, the resist feature 7 is etched only 3 to 5 times faster than the polycrystalline silicon layer 4. Therefore, the anti-reflective coating layer 6 desirably prevents damage of the polycrystalline silicon layer 4 during the production process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of producing a semiconductor device, comprising:
    a) providing a semiconductor substrate having a surface;
    b) forming a layer of gate electrode material above said surface of said substrate;
    c) forming a resist feature comprised of a thermo-variable material above said layer of gate electrode material, said resist feature having a lateral dimension;
    d) reducing the lateral dimension of said thermo-variable resist feature by approximately 5 percent by performing a heat treatment process at a temperature ranging from approximately 90–150° C.; and
    e) patterning at least said layer of gate electrode material using said resist feature with said reduced lateral dimension.

2. The method according to claim 1, wherein said heat treatment process is performed for a duration of approximately 2 minutes.

3. A method of producing a semiconductor device, comprising:
    a) providing a semiconductor substrate having a surface;
    b) forming a layer of gate electrode material above said surface of said substrate;
    c) forming a resist feature comprised of a thermo-variable material above said layer of gate electrode material, said resist feature having a lateral dimension;
    d) reducing the lateral dimension of said thermo-variable resist feature by performing a heat treatment process at a temperature ranging from approximately 90–150° C.; and
    e) patterning at least said layer of gate electrode material using said resist feature with said reduced lateral dimension.

4. A method of producing a semiconductor device, comprising:
    a) providing a semiconductor substrate having a surface;
    b) forming a layer of gate electrode material above said surface of said substrate;
    c) forming a resist feature comprised of a thermo-variable material above said layer of gate electrode material, said resist feature having a lateral dimension;
    d) reducing the lateral dimension of said thermo-variable resist feature by performing a heat treatment process at a temperature that ranges from approximately 90–150° C. for a duration of approximately 2 minutes; and
    e) patterning at least said layer of gate electrode material using said resist feature with said reduced lateral dimension.

5. A method of producing a semiconductor device, comprising:
    a) providing a semiconductor substrate having a surface;
    b) forming a layer of gate electrode material above said surface of said substrate;
    c) forming a resist feature comprised of a thermo-variable material above said layer of gate electrode material, said resist feature having a lateral dimension;

d) reducing the lateral dimension of said thermo-variable resist feature by performing a heat treatment process, wherein said lateral dimension of said thermo-variable resist feature is reduced by approximately 5 percent; and e) patterning at least said layer of gate electrode material using said resist feature with said reduced lateral dimension.

* * * * *